US012638713B2

(12) United States Patent　　(10) Patent No.: US 12,638,713 B2
Hu et al.　　(45) Date of Patent:　May 26, 2026

(54) DISPLAY MODULE AND MOBILE TERMINAL

(71) Applicant: Wuhan China Star Optoelectronics Semiconductor Display Technology Co., Ltd., Wuhan (CN)

(72) Inventors: Peng Hu, Wuhan (CN); Congcong Jiang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 599 days.

(21) Appl. No.: 17/600,257

(22) PCT Filed: Jul. 26, 2021

(86) PCT No.: PCT/CN2021/108454
§ 371 (c)(1),
(2) Date: Apr. 4, 2024

(87) PCT Pub. No.: WO2023/272841
PCT Pub. Date: Jan. 5, 2023

(65) Prior Publication Data
US 2024/0241402 A1　　Jul. 18, 2024

(30) Foreign Application Priority Data
Jun. 29, 2021　(CN) .......................... 202110725789.7

(51) Int. Cl.
*G02F 1/1335* (2006.01)
*G02F 1/1333* (2006.01)
(Continued)

(52) U.S. Cl.
CPC .. *G02F 1/133528* (2013.01); *G02F 1/133331* (2021.01); *G02F 1/1345* (2013.01);
(Continued)

(58) Field of Classification Search
CPC ......... G02F 1/133528; G02F 1/133331; G02F 1/1345; H10K 59/131; H10K 59/873; H10K 59/179
See application file for complete search history.

(56) References Cited

U.S. PATENT DOCUMENTS

2021/0399076 A1* 12/2021 Lee ....................... H10K 77/111

FOREIGN PATENT DOCUMENTS

| CN | 109559639 | 4/2019 |
| CN | 111028677 | 4/2020 |

(Continued)

OTHER PUBLICATIONS

PE2E translation of CN111028677A (Year: 2020).*
PE2E translation of CN112116879A (Year: 2020).*

*Primary Examiner* — David Y Chung

(57) ABSTRACT

A display module for a mobile terminal includes a cover plate; a display panel arranged on an inner side of the cover plate and including a display region, a bonding region, and a bending region between the display region and the bonding region; and a polarizer arranged between the cover plate and the display panel. The bonding region includes a wiring layer which at least partially extends into the bending region, and the polarizer extends out of the display region and covers the wiring layer in the bending region.

14 Claims, 5 Drawing Sheets

(51) Int. Cl.
  *G02F 1/1345*  (2006.01)
  *H10K 59/131*  (2023.01)
  *H10K 59/179*  (2023.01)
  *H10K 59/80*  (2023.01)

(52) U.S. Cl.
  CPC ......... *H10K 59/131* (2023.02); *H10K 59/179*
    (2023.02); *H10K 59/873* (2023.02); *G02F*
            *2201/50* (2013.01)

(56)      References Cited

FOREIGN PATENT DOCUMENTS

| | | | | | |
|---|---|---|---|---|---|
| CN | 111028677 A | * | 4/2020 | .............. | G09F 9/00 |
| CN | 111524944 | | 8/2020 | | |
| CN | 112116879 | | 12/2020 | | |
| CN | 112116879 A | * | 12/2020 | .............. | G09F 9/33 |
| CN | 112164713 | | 1/2021 | | |
| CN | 212966112 | | 4/2021 | | |
| CN | 112951890 | | 6/2021 | | |
| JP | 2018-200354 | | 12/2018 | | |

* cited by examiner

1

DISPLAY MODULE AND MOBILE TERMINAL

RELATED APPLICATIONS

This application is a National Phase of PCT Patent Application No. PCT/CN2021/108454 having International filing date of Jul. 26, 2021, which claims the benefit of priority of Chinese Patent Application No. 202110725789.7 filed on Jun. 29, 2021. The contents of the above applications are all incorporated by reference as if fully set forth herein in their entirety.

FIELD AND BACKGROUND OF THE INVENTION

The present application relates to a field of display technology and in particular, to a display module and a mobile terminal.

With the rapid development of technology in modern society, electronic products such as mobile phones, computers, and TVs are widely used and indispensable to everyday life. Therefore, electronic display devices such as liquid crystal displays (LCDs) and organic electroluminescence displays (OLEDs) are used extensively. Flexibility and foldability properties are the biggest advantages of the OLED products. Therefore, four-curved-surface products can be launched.

Compared with conventional dual-curved-surface products, four-curved-surface products are also bent at a lower border. In conventional designs, the flexible printed circuit board (FPC) is usually placed at the lower border of the product, where there are a lot of metal lines. Most metal lines are not resistant to bending, especially gate on array (GOA) lines that transmit signals. Therefore, in order to prevent the metal lines from breaking in a bending region, there is an urgent need to develop new multi-curved display devices, especially for four-curved-surface screens.

SUMMARY OF THE INVENTION

Technical Problem

The present application provides a display module and a mobile terminal, which can avoid abnormal problems such as suspension of a display panel body.

Solution to Problem

Technical Solution

Accordingly, the present application provides technical solutions as follows:

The present application provides a display module, including:

a cover plate;

a display panel disposed on an inner side of the cover plate, the display panel including a display region, a bonding region, and a bending region arranged between the display region and the bonding region; and a polarizer disposed between the cover plate and the display panel;

wherein the bonding region includes a wiring layer at least partially extending into the bending region, and the polarizer extends out of the display region and covers the wiring layer in the bending region.

In the display module according to one embodiment of the present application, the display region includes at least a plane region and a curved-surface region; the plane region, the curved-surface region, the bending region, and the bonding region are smoothly and integrally connected in sequence;

wherein the polarizer extends out of the curved-surface region and covers the wiring layer in the bending region.

In the display module according to one embodiment of the present application, the display panel includes a first curved-surface region, a second curved-surface region, a third curved-surface region, and a fourth curved-surface region adjacent to the plane region, and the bonding region is arranged at one side of the first curved-surface region;

the wiring layer includes at least one metal wiring region arranged in the bending region; and the polarizer includes a plurality of protrusions extending from the display region to the bending region, and the protrusions cover the metal wiring region in the bending region.

In the display module according to one embodiment of the present application, the wiring layer includes a first metal wiring region and a second metal wiring region which are located in the bending region and spaced apart from each other; the polarizer includes a first protruding portion and a second protruding portion extending from the display region to the bending region; the first protruding portion covers the first metal wiring region in the bending region; and the second protruding portion covers the second metal wiring region in the bending region.

In the display module according to one embodiment of the present application, the display panel further includes a protective layer covering the bending region, and the protective layer and the polarizer are disposed in a same layer and contact each other.

In the display module according to one embodiment of the present application, the display panel further includes an adhesive layer disposed between the display panel and the polarizer, and the adhesive layer at least covers the wiring layer in the bending region.

In the display module according to one embodiment of the present application, the polarizer has a thickness of 46 micrometers to 140 micrometers.

In the display module according to one embodiment of the present application, an elastic modulus of the polarizer ranges from 2400 MPA to 4500 MPA.

In the display module according to one embodiment of the present application, a bending radius of the polarizer is greater than or equal to 2 mm.

In the display module according to one embodiment of the present application, the display module further includes a first backplate and a second backplate arranged at one side of the display panel away from a display side, and a support layer arranged between the first backplate and the second backplate.

The present application provides a mobile terminal, including a terminal body and a display panel electrically connected to the terminal body, wherein the display panel includes:

a cover plate;

a display panel arranged on an inner side of the cover plate, the display panel including a display region, a bonding region, and a bending region arranged between the display region and the bonding region; and a polarizer arranged between the cover plate and the display panel;

wherein the bonding region includes a wiring layer at least partially extending into the bending region, and the polarizer extends out of the display region and covers the wiring layer in the bending region.

In the mobile terminal according to one embodiment of the present application, the display region includes at least a plane region and a curved-surface region; the plane region, the curved-surface region, the bending region, and the bonding region are smoothly and integrally connected in sequence;

wherein the polarizer extends out of the curved-surface region and covers the wiring layer in the bending region.

In the mobile terminal according to one embodiment of the present application, the display panel includes a first curved-surface region, a second curved-surface region, a third curved-surface region, and a fourth curved-surface region adjacent to the plane region, and the bonding region is arranged at one side of the first curved-surface region;

the wiring layer includes at least one metal wiring region arranged in the bending region; and the polarizer includes a plurality of protrusions extending from the display region to the bending region, and the protrusions cover the metal wiring region in the bending region.

In the mobile terminal according to one embodiment of the present application, the wiring layer includes a first metal wiring region and a second metal wiring region which are located in the bending region and spaced apart from each other; the polarizer includes a first protruding portion and a second protruding portion extending from the display region to the bending region; the first protruding portion covers the first metal wiring region in the bending region; and the second protruding portion covers the second metal wiring region in the bending region.

In the mobile terminal according to one embodiment of the present application, the display panel further includes a protective layer covering the bending region, and the protective layer and the polarizer are disposed in a same layer and contact each other.

In the mobile terminal according to one embodiment of the present application, the display panel further includes an adhesive layer disposed between the display panel and the polarizer, and the adhesive layer at least covers the wiring layer in the bending region.

In the mobile terminal according to one embodiment of the present application, the polarizer has a thickness of 46 micrometers to 140 micrometers.

In the mobile terminal according to one embodiment of the present application, an elastic modulus of the polarizer ranges from 2400 MPA to 4500 MPA.

In the mobile terminal according to one embodiment of the present application, a bending radius of the polarizer is greater than or equal to 2 mm.

Advantages of Invention

Beneficial Effect

The advantages of the present application: the present application utilizes flexibility and ductility of the polarizer to extend the polarizer out of the display region and cover the wiring layer in the bending region, thereby enhancing a support function of the polarizer, effectively preventing a problem in conventional techniques, in which metal lines in the wiring layer are broken due to concentrated stresses as a result of suspension of the display panel.

BRIEF DESCRIPTION OF THE SEVERAL VIEWS OF THE DRAWINGS

Description of Attached Drawings

The present application is described in detail below in conjunction with the accompanying drawings to make clear the technical solutions and other beneficial effects of the present application.

DESCRIPTION OF REFERENCE NUMBER

| Reference Number | Part Name | Reference Number | Part Name |
|---|---|---|---|
| 10 | cover plate | 80 | driving chip |
| 20 | Polarizer | 90 | support layer |
| 21 | protrusion | 100 | display region |
| 211 | first protruding portion | 110 | plane region |
| 212 | second protruding portion | 120 | curved-surface region |
| 30 | wiring layer | 121 | first curved-surface region |
| 31 | metal wiring region | 122 | second curved-surface region |
| 311 | first metal wiring region | 123 | third curved-surface region |
| 312 | second metal wiring region | 124 | fourth curved-surface region |
| 40 | adhesive layer | 200 | bending region |
| 50 | protective layer | 210 | first bending region |
| 61 | first backplate | 220 | second bending region |
| 62 | second backplate | 300 | bonding region |
| 70 | flexible circuit board | | |

EMBODIMENTS OF INVENTION

Description of Specific Embodiments of the Invention

The present application provides a display panel, a manufacturing method of the display panel, and a display device. In order to make the purposes, technical solutions, and functions of the present application clearer and more definite, the present application is described in detail below with reference to the accompanying drawings and embodiments. It should be understood that the specific embodiments described herein are only used to explain the present application, and are not used to limit the present application.

Figure 1:
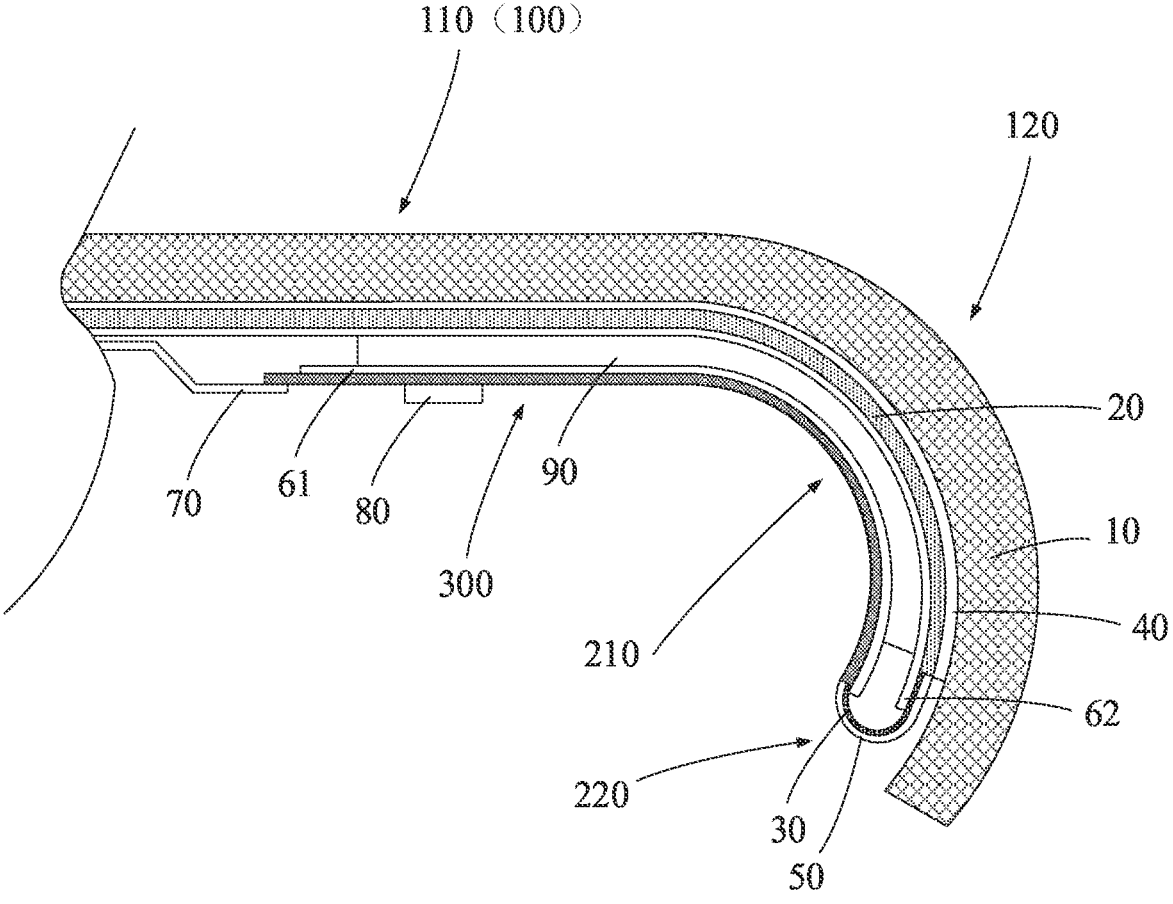
FIG. 1 is a schematic cross-sectional view illustrating a conventional display module.
Figure 2:
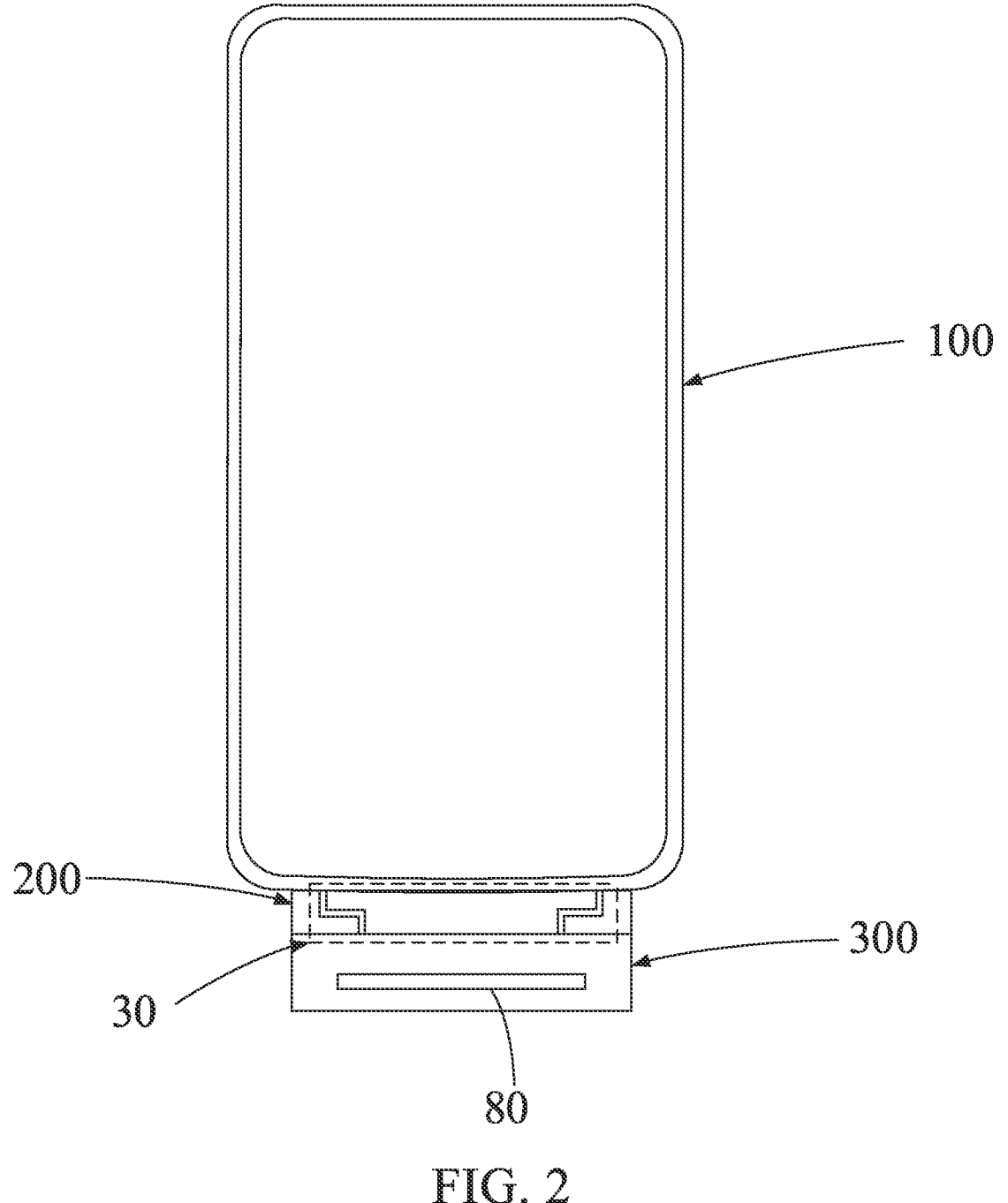
FIG. 2 is a schematic planar structural view illustrating a conventional display panel.

Please refer to FIG. 1 and FIG. 2 together. FIG. 1 is a schematic cross-sectional structural view illustrating a conventional display module, and FIG. 2 is a schematic planar structural view illustrating a conventional display panel.

In conventional techniques, a bottom of a flexible display panel is provided with a dense wiring region and bonding region 300, which is also called a terminals region or an external wiring region. A process of bending the terminals region to a back of the flexible display panel is called a pad bending process which aims to narrow a bottom border. In a four-curved-surface display panel, for bonding and bending, a wiring layer 30 first passes through a first bending region 210 to be bent to the back of the display panel. Since a lower end of the display panel needs to be designed as a curved surface to achieve frameless display, the wiring layer 30 needs to be attached to a curved side of the display panel. In other words, the wiring layer 30 needs to bend again in a second bending region 220. However, the wiring layer 30 has a lot of metal lines, and most metal lines are not resistant to bending. Therefore, when the wiring layer 30 is bent, the metal lines located in the wiring layer 30 have a great risk of breakage due to bending stresses. Accordingly, the present application provides a display module and a mobile terminal to solve the above-mentioned problems.

As shown in FIGS. 2 to 5, the present application provides a display module according to one embodiment. The display module includes a cover plate 10; a display panel (not labelled in the drawings) disposed on an inner side of the cover plate 10, the display panel including a display region 100, a bonding region 300, and a bending region 200 arranged between the display region 100 and the bonding region 300; a polarizer 20 disposed between the cover plate 10 and the display panel; wherein the bonding region 300 includes a wiring layer 30 that at least partially extends to the bending region 200, and the polarizer 20 extends out of the display region 100 and covers the wiring layer 30 in the bending region 200.

The present application utilizes flexibility and ductility of the polarizer 20. By extending the polarizer 20 out of the display region 100 to cover the wiring layer 30 in the bending region 200, the present application enhances a support function of the polarizer 20 to effectively prevent a display panel body from being suspended as a result of bending of the display panel. Moreover, bendability of wiring lines in the bending region 200 is improved to prevent breakage of metal lines in the wiring layer 30 resulting from the suspension of the display panel body.

Technical solutions of the present application will now be described in conjunction with specific embodiments.

Figure 3:
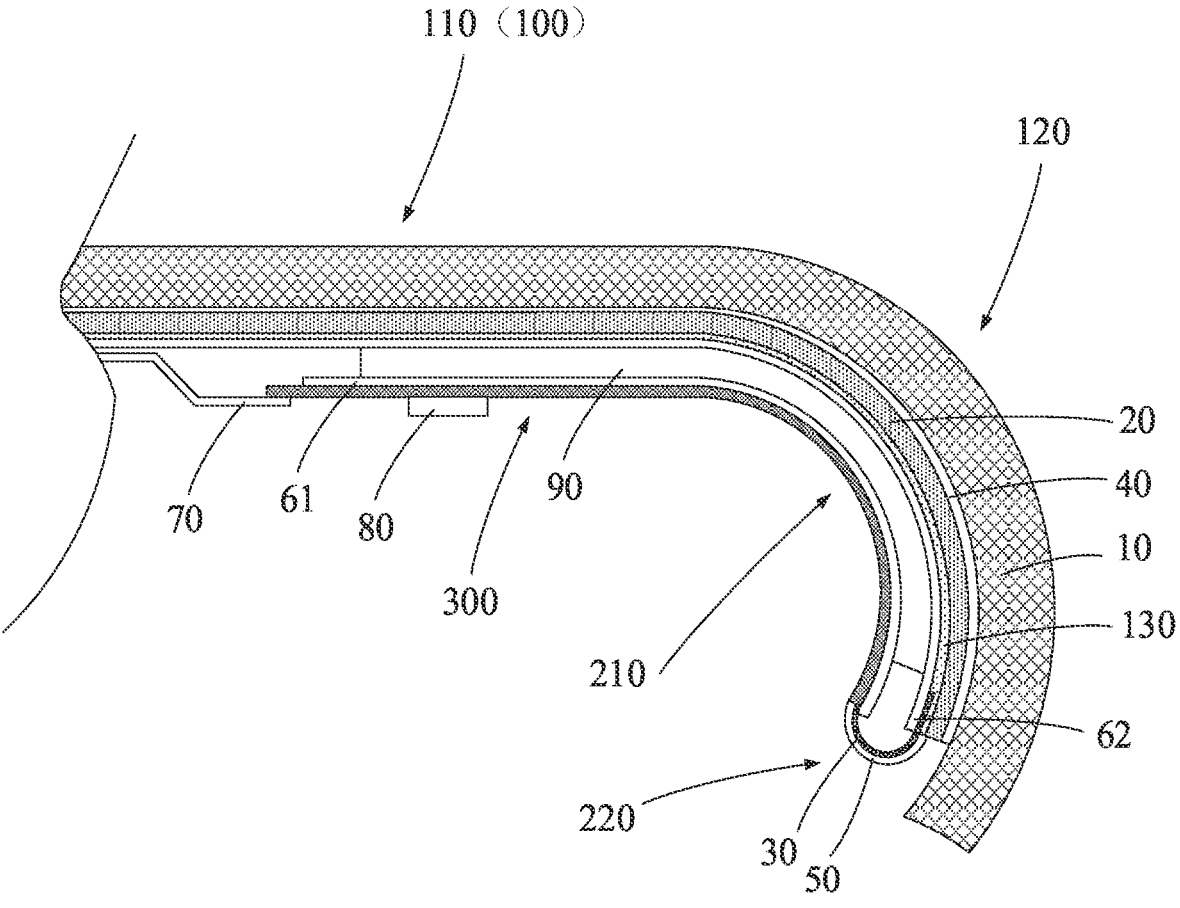
FIG. 3 is a schematic cross-sectional structural view illustrating a display module according to one embodiment of the present application.

Please refer to FIG. 3, which is a schematic cross-sectional view illustrating a display module according to one embodiment of the present application.

The present embodiment provides a display module that is flexible and can be used in electronic devices such as mobile phone screens, tablet computer screens, curtain walls, and display windows.

In the present embodiment, the display module includes a cover plate 10; a display panel disposed on an inner side of the cover plate 10, the display panel including a display region 100, a bonding region 300, and a bending region 200 arranged between the display region 100 the bonding region 300; and a polarizer 20 disposed between the cover plate 10 and the display panel.

In the present embodiment, the cover plate 10 includes a flat area and a curved area of the cover plate 10, and the curved area is located on at least one side of the flat area. The curved area of the cover plate 10 and the flat area are smoothly connected. The display module is disposed on the inner side of the cover plate 10, wherein an included angle between the curved area of the cover plate 10 and the flat area generally ranges from 80° to 160°. It can be understood that a size of the included angle is determined by actual manufacturing processes, so is not described specifically here. It should be noted that the cover plate 10 can be selected from any one of cover glass (CG) or a 3D cover plate 10, and the present embodiment is not limited in this regard.

In the present embodiment, the display region 100 includes a display area for realizing a display function of the display panel. A main material of the bending region 200 is a flexible material. The bending region 200 is provided with metal lines for signal connection between the display region 100 and a driving circuit. Specifically, the display region 100 includes at least a plane region 110 and a curved-surface region 120. The plane region 110, the curved-surface region 120, the bending region 200, and the bonding region 300 are smoothly and integrally connected in sequence.

In the present embodiment, the bonding region 300 includes a wiring layer 30 that at least partially extends into the bending region 200. Specifically, the wiring layer 30 is connected to one side of the bending region 200 away from the curved-surface region 120 and bent to be attached to the bonding region 300 of the display panel. It can be understood that the display region 100 has a display device, and the wiring layer 30 includes multiple metal lines extending into the display region 100 through the bending region 200 to be connected to signals of the display device, so as to transmit display signals.

In the present embodiment, the polarizer 20 is a flexible polarizer with good flexibility and ductility. A body of the polarizer 20 is made of polyvinyl alcohol (PVA), and a PVA film consisting of a polymer material and dyed with various organic dyes with dichroic properties. The PVA film is extended under certain humidity and temperature conditions, and absorbs the dichroic dyes to form polarization properties. The body of the polarizer 20 is formed after dehydration and drying.

In the present embodiment, the polarizer 20 is located above the display region 100 of the display panel, and the polarizer 20 is attached to the cover plate 10 through an adhesive layer 40. The polarizer 20 extends beyond the curved-surface region 120 and covers the wiring layer 30 in the bending region 200. It should be noted that the adhesive layer 40 includes, but is not limited to, photoresist; and the present embodiment is not limited in this regard.

Figure 4:
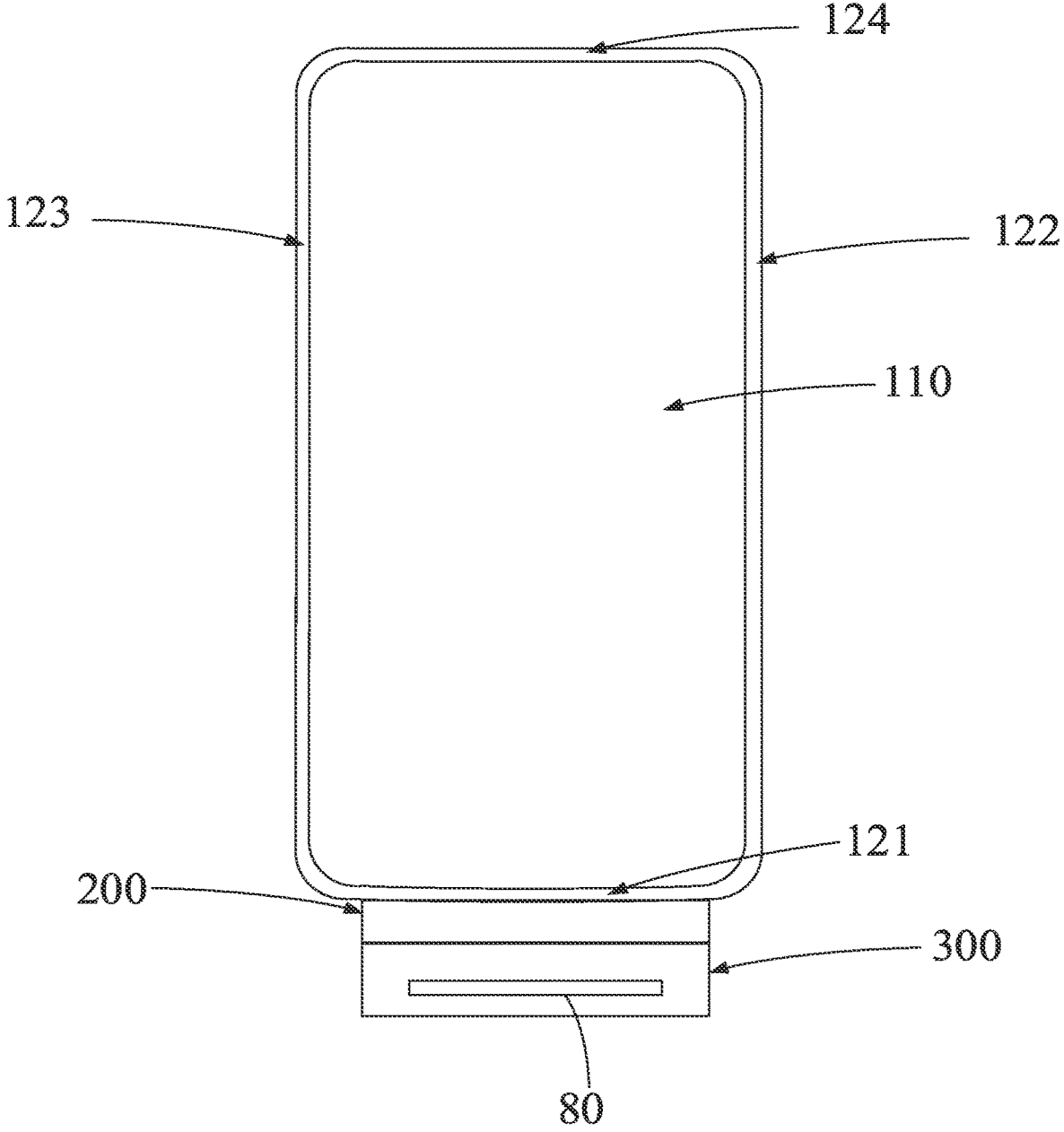
FIG. 4 is a schematic planar structural view illustrating a display panel according to one embodiment of the present application.
Figure 5:
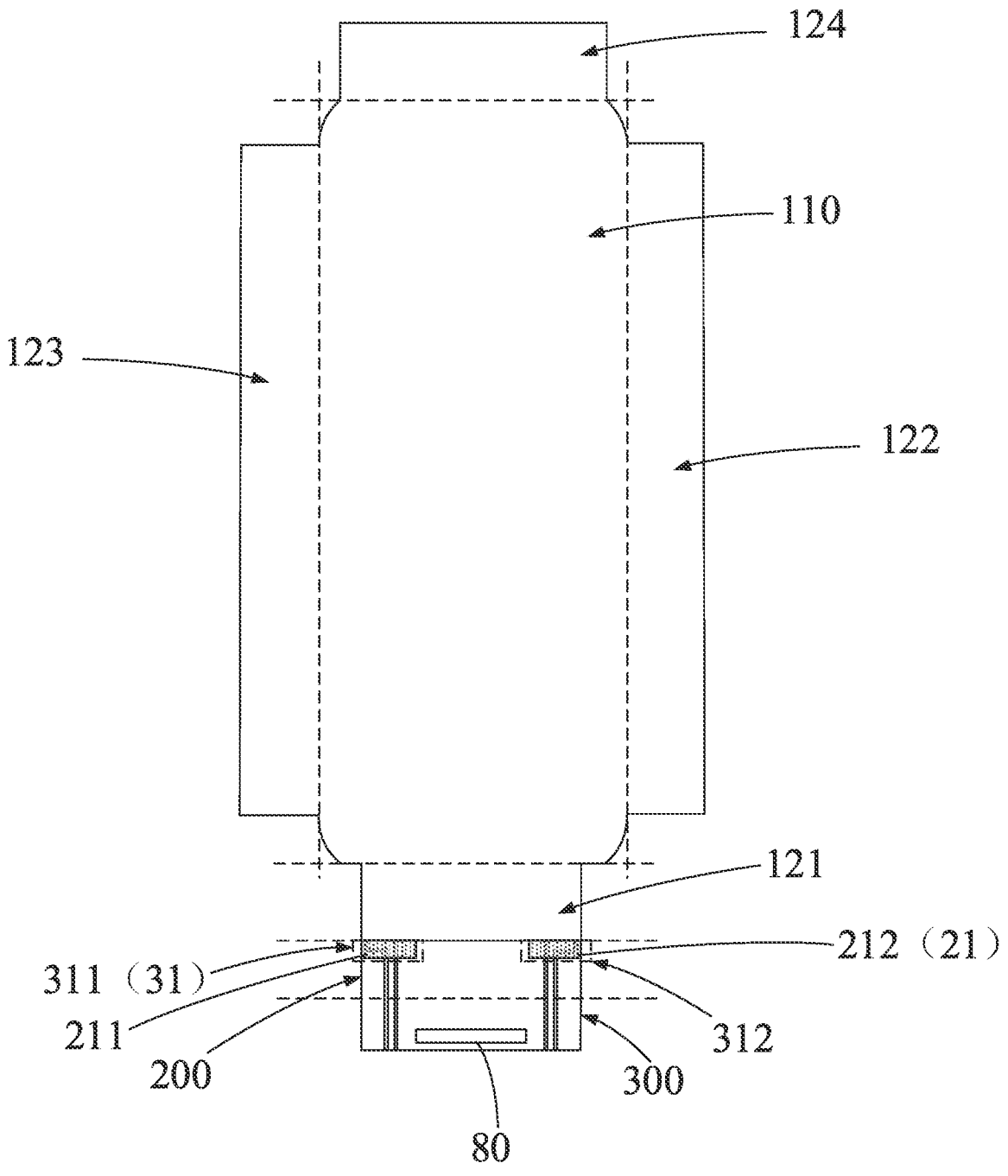
FIG. 5 is a schematic view illustrating an expanded structure of the display panel according to one embodiment of the present application.

Please refer to FIG. 4 and FIG. 5 together. FIG. 4 is a schematic planar structural view illustrating a display panel according to one embodiment of the present application. FIG. 5 is a schematic view of an expanded structure of the display panel according to one embodiment of the present application.

In the present embodiment, the display panel includes a first curved-surface region 121, a second curved-surface region 122, a third curved-surface region 123, and a fourth curved-surface region 124 which are adjacent to the plane region 110. To be specific, the display panel is a four-curved-surface display panel. The bonding region 300 is located at one side of the first curved-surface region 121. The wiring layer 30 includes at least one metal wiring region 31 in the bending region 200. The polarizer 20 includes a plurality of protrusions 21 extending from the display region 100 to the bending region 200, and the protrusions 21 cover the at least one metal wiring region 31 in the bending region 200.

In the present embodiment, many metal lines are provided in the metal wiring region 31. Most of the metal lines are not resistant to bending, especially those gate on array (GOA)

lines used to transmit signals. In the present embodiment, the polarizer 20 includes multiple protrusions 21 extending from the display region 100 to the bending region 200, the protrusions 21 cover the at least one metal wiring region 31 in the bending region 200. The present application effectively prevents the display panel body from being suspended as a result of bending of the display panel, and also improves bendability of the metal lines in the bending region 200. This prevents a problem in conventional techniques, in which the metal lines in the wiring layer 30 are broken from the stress concentration of the metal lines in the wiring layer 30 due to the suspension of the display panel body.

Further, the wiring layer 30 includes a first metal wiring region 311 and a second metal wiring region 312 both arranged in the bending region 200 and spaced apart from each other. Specifically, the first metal wiring region 311 is a GOA wiring region, the second metal wiring region 312 is a GOA wiring region, and the polarizer 20 includes a first protruding portion 211 and a second protruding portion 212 extending from the display region 100 to the bending region 200. The first protruding portion 211 covers the first metal wiring region 311 in the bending region 200, and the second protruding portion 212 covers the second metal wiring region 312 in the bending region 200. It can be understood that, in the present embodiment, the foregoing description "the first metal wiring region 311 is a GOA wiring region, and the second metal wiring region 312 is a GOA wiring region" is only an example for illustration; and the present embodiment is not limited in this regard.

The present embodiment utilizes the flexibility and ductility of the polarizer 20. The polarizer 20 includes the first protruding portion 211 and the second protruding portion 212 extending from the display region 100 to the bending region 200. The first protruding portion 211 covers the first metal wiring region 311 in the bending region 200, and the second protruding portion 212 covers the second metal wiring region 312 in the bending region 200, thus enhancing the support function of the polarizer 20. As a result, the present application can effectively prevent the display panel body from being suspended as a result of bending the display panel, also improve the bendability of the metal lines in the bending region 200, and reduce a risk of breakage of the metal lines, thus improving display performance of the display panel.

It can be understood that the description "the display panel includes a first curved-surface region 121, a second curved-surface region 122, a third curved-surface region 123, and a fourth curved-surface region 124 which are adjacent to the plane area 110; and the bonding region 300 is located at one side of the first curved-surface region 121" is only an example for illustration. The present embodiment is not limited to a particular type of the display panel. That is to say, the present embodiment is not intended to limit positions of the bonding region 300.

It should be noted that in the present embodiment, a thickness of the polarizer 20 ranges from 46 μm to 140 μm, and is preferably 46 μm, 56 μm, 76 μm, 86 μm, or 96 μm. An elastic modulus of the polarizer 20 is 2500 MPA to 4500 MPA, and is preferably 2500 MPA, 3000 MPA, or 3600 MPA, so as to be softer and thinner. A bending radius of the polarizer 20 is greater than or equal to 0.2 mm, and is preferably 0.2 mm.

In the present embodiment, it is preferable that the thickness of the polarizer 20 is preferably 46 μm, the clastic modulus is 2500 MPA, and the bending radius is 0.2 mm. Among them, the thickness of the polarizer 20 is preferably 46 μm to prevent excessive stresses from bending of the polarizer 20, which affects a bending result. Also, compared with conventional techniques, the present embodiment utilizes the flexibility and ductility of the polarizer 20 to make the display panel bend to a greater extent and effectively increase a screen ratio of a display. On the other hand, by extending a length of the polarizer 20, the polarizer 20 covers the wiring layer 30, thus preventing the display panel body from being suspended as a result of bending the display panel. Moreover, the present application improves the bendability of the metal lines in the bending region 200, and prevents a problem in conventional techniques that the metal lines in the wiring layer 30 are broken by concentrated stresses due to suspension of the display panel body.

It can be understood that the description "the thickness of the polarizer 20 is 46 μm, the clastic modulus is 2500 MPA, and the bending radius is 0.2 mm" is only an example for illustration, and the present embodiment is not limited in this regard.

In the present embodiment, the display panel further includes an adhesive layer 130 disposed between the display panel and the polarizer 20, and the adhesive layer 130 at least covers the wiring layer 30 in the bending region 200.

In the present embodiment, the adhesive layer 130 includes, but is not limited to, an optical adhesive. The optical adhesive is a special adhesive used to bond transparent optical elements. The optical adhesive is colorless and transparent with light transmittance of 90% or more. The optical adhesive has good bonding strength, can be cured at room temperatures or medium temperatures, and has little cure shrinkage. The optical adhesive is one of important raw materials for touch screens. It is a double-sided adhesive tape without a substrate material. By adding the optical adhesive between the display panel and the polarizer 20, the display panel and the polarizer 20 can be bonded to each other by using the double-sided bonding properties of the optical adhesive to prevent the display panel body from being suspended as a result of bending of the display panel. Accordingly, the present application can increase the adhesion between the polarizer 20 and the display panel. Moreover, the adhesive layer 130 is provided to cover at least the wiring layer 30 located in the bending region 200, so the adhesion between the polarizer 20 and the wiring layer 30 is increased, thereby reducing the risk of the breakage of the metal lines.

In the present embodiment, the display panel further includes a protective layer 50 covering the bending region 200. The protective layer 50 and the polarizer 20 are disposed in a same layer and contact each other. Furthermore, the protective layer 50 covers the first bending region 210.

The protective layer 50 includes, but is not limited to, an ultraviolet (UV) curing adhesive. The UV curing adhesive is a type of adhesive that can only be cured by UV light irradiation, and can be used as an adhesive for bonding. A working principle is that a photoinitiator in a UV curing material absorbs UV light under irradiation of the UV light and generates active free radicals or cations, which initiates monomer polymerization and crosslinking chemical reactions, so that the adhesive changes from liquid to solid within a few seconds. In the present embodiment, the UV curing adhesive is selected as the protective layer 50 and covers the wiring layer 30 in the first bending region 210, so the metal lines in the wiring layer 30 can be well protected.

It should be noted that, in the preset embodiment, an organic thin film layer (not illustrated in the drawings) is further disposed on the wiring layer 30, and the organic thin film layer covers the wiring layer 30. It can be understood that, in the present embodiment, by arranging the organic thin film layer on the wiring layer 30, mechanical damage can be reduced, thereby preventing the metal lines from being damaged and broken due to external factors. Furthermore, such a configuration release stresses for the metal lines when the metal lines are bent.

It should be noted that the display module further includes a flexible circuit board 70. The flexible circuit board 70 is arranged on a back of the display region 100, and the flexible circuit board 70 is bonded to the bonding region 300 of the display panel. In other words, the flexible circuit board 70 is electrically connected to the display region 100 through the bonding region 300 to drive the display region 100 to emit light. The flexible circuit board 70 can be, for example, a flexible printed circuit board (FPC).

Furthermore, in the present embodiment, a driving chip 80 is also bonded in the bonding region 300. The display region 100 includes light-emitting units (not illustrated in the drawings) and driving signal lines (not illustrated in drawings). The wiring layer 30 includes metal jumper lines. The metal jumper lines are electrically connected to the driving signal lines. The metal jumper lines help to reduce a density of the driving signal lines. The driving chip 80 is electrically connected to the light-emitting units through the driving signal lines and the metal jumper lines to drive the light-emitting units to emit light. That is to say, by arranging the metal jumper lines in the bending region 200 to realize a jumper layer, a space utilization rate is further improved, thus reducing a risk of breakage of the metal lines.

In the present embodiment, the display module further includes a first backplate 61, a second backplate 62, and a support layer 90 between the first backplate 61 and the second backplate 62. The first backplate 61, the second backplate 62, and the support layer 90 are all bent corresponding to the display region 100 to form curved surfaces. Bending angles or curvatures of the curved surfaces are the same as bending angles or curvatures of the wiring layer 30 and the display region 100, so that the support layer 90 can be attached to the wiring layer 30 and the display region 100 at the same time to provide support when the wiring layer 30 is bent and folded for bonding, which improves production yields.

The present embodiment also provides a mobile terminal. The mobile terminal includes a terminal body and the display module described in any of the above embodiments. The terminal body is electrically connected to the display module.

It can be understood that the display module has been described in detail in the above embodiments, and the descriptions are not repeated here.

In practice, the mobile terminal can be a display screen of a smart phone, a tablet computer, a notebook computer, a smart bracelet, a smart watch, smart glasses, a smart helmet, a desktop computer, a smart TV, or a digital camera, or can be even used in electronic devices with flexible display screens.

In summary, the present application provides a display module and a mobile terminal. The display module comprises a cover plate; a display panel disposed on an inner side of the cover plate, the display panel comprising a display region, a bonding region, and a bending region between the display region and the bonding region; and a polarizer disposed between the cover plate and the display panel. The bonding region comprises a wiring layer which at least partially extends into the bending region, and the polarizer extends out of the display region and covers the wiring layer in the bending region. In the present application, the polarizer extends out of the display region and covers the wiring layer in the bending region, thereby enhancing a support function of the polarizer. Accordingly, the present application can effectively avoid a problem in conventional techniques, in which breakage (breakage of metal lines) occurs because a display panel body is suspended to cause stress concentration of the metal lines in the wiring layer.

In the above-mentioned embodiments, the description of each embodiment has its own emphasis. For those that are not described in detail in one embodiment, reference may be made to related descriptions of other embodiments.

It can be understood that for those of ordinary skill in the art, equivalent substitutions or changes can be made according to the technical solution and inventive concept of the present application, and all these changes or substitutions should fall within the protection scope of the appended claims of the present application.

What is claimed is:

1. A display module, comprising:
a cover plate;
a display panel disposed on an inner side of the cover plate, the display panel comprising a display region, a bonding region, a bending region arranged between the display region and the bonding region, wherein the display region comprises at least a plane region and a curved-surface region; the plane region, the curved-surface region, the bending region, and the bonding region are connected smoothly in sequence and in an integral form; and
a polarizer disposed between the cover plate and the display panel;
wherein the bonding region comprises a wiring layer at least partially extending into the bending region, the polarizer extends out of the display region and covers the wiring layer in the bending region, and the polarizer extends out of the curved-surface region and covers the wiring layer in the bending region;
wherein the display panel comprises a first curved-surface region, a second curved-surface region, a third curved-surface region, and a fourth curved-surface region adjacent to the plane region, and the bonding region is arranged at one side of the first curved-surface region;
wherein the wiring layer comprises a first metal wiring region and a second metal wiring region which are located in the bending region and spaced apart from each other; and
the polarizer comprises a first protruding portion and a second protruding portion extending from the display region to the bending region, the first protruding portion covers the first metal wiring region in the bending region, and the second protruding portion covers the second metal wiring region in the bending region.

2. The display module according to claim 1, wherein the display panel further comprises a protective layer covering the bending region, and the protective layer and the polarizer are disposed in a same layer and contact each other.

3. The display module according to claim 2, wherein the display panel further comprises an adhesive layer disposed between the display panel and the polarizer, and the adhesive layer at least covers the wiring layer in the bending region.

4. The display module according to claim 1, wherein the polarizer has a thickness of 46 micrometers to 140 micrometers.

5. The display module according to claim 1, wherein an elastic modulus of the polarizer ranges from 2400 MPA to 4500 MPA.

6. The display module according to claim 1, wherein a bending radius of the polarizer is greater than or equal to 2 mm.

7. The display module according to claim 1, wherein the display module further comprises a first backplate and a second backplate arranged at one side of the display panel away from a display side, and a support layer arranged between the first backplate and the second backplate.

8. A mobile terminal, comprising:

a terminal body and a display panel electrically connected to the terminal body, wherein the display panel comprises:

a cover plate;

a display panel arranged on an inner side of the cover plate, the display panel comprising a display region, a bonding region, a bending region arranged between the display region and the bonding region, wherein the display region comprises at least a plane region and a curved-surface region; the plane region, the curved-surface region, the bending region, and the bonding region are connected smoothly in sequence and in an integral form; and a polarizer arranged between the cover plate and the display panel;

wherein the bonding region comprises a wiring layer at least partially extending into the bending region, the polarizer extends out of the display region and covers the wiring layer in the bending region, and the polarizer extends out of the curved-surface region and covers the wiring layer in the bending region;

wherein the display panel comprises a first curved-surface region, a second curved-surface region, a third curved-surface region, and a fourth curved-surface region adjacent to the plane region, and the bonding region is arranged at one side of the first curved-surface region;

wherein the wiring layer comprises a first metal wiring region and a second metal wiring region which are located in the bending region and spaced apart from each other; and the polarizer comprises a first protruding portion and a second protruding portion extending from the display region to the bending region, the first protruding portion covers the first metal wiring region in the bending region, and the second protruding portion covers the second metal wiring region in the bending region.

9. The mobile terminal according to claim 8, wherein the display panel further comprises a protective layer covering the bending region, and the protective layer and the polarizer are disposed in a same layer and contact each other.

10. The mobile terminal according to claim 9, wherein the display panel further comprises an adhesive layer disposed between the display panel and the polarizer, and the adhesive layer at least covers the wiring layer in the bending region.

11. The mobile terminal according to claim 8, wherein the polarizer has a thickness of 46 micrometers to 140 micrometers.

12. The mobile terminal according to claim 8, wherein an elastic modulus of the polarizer ranges from 2400 MPA to 4500 MPA.

13. The display module mobile terminal according to claim 8, wherein a bending radius of the polarizer is greater than or equal to 2 mm.

14. The display module mobile terminal according to claim 8, wherein the display module further comprises a first backplate and a second backplate arranged at one side of the display panel away from a display side, and a support layer arranged between the first backplate and the second backplate.

* * * * *